US012653062B2

(12) United States Patent
Shim et al.

(10) Patent No.: US 12,653,062 B2
(45) Date of Patent: Jun. 9, 2026

(54) SEMICONDUCTOR PACKAGES AND METHODS OF FORMING RDL AND SIDE AND BACK PROTECTION FOR SEMICONDUCTOR DEVICE

(71) Applicant: UTAC Headquarters Pte. Ltd., Singapore (SG)

(72) Inventors: Il Kwon Shim, Singapore (SG); Ronnie M. De Villa, Singapore (SG); Dzafir Bin Mohd Shariff, Singapore (SG)

(73) Assignee: UTAC Headquarters Pte. Ltd., Singapore (SG)

( * ) Notice: Subject to any disclaimer, the term of this patent is extended or adjusted under 35 U.S.C. 154(b) by 390 days.

(21) Appl. No.: 18/302,627

(22) Filed: Apr. 18, 2023

(65) Prior Publication Data

US 2023/0343668 A1     Oct. 26, 2023

Related U.S. Application Data

(60) Provisional application No. 63/363,317, filed on Apr. 21, 2022.

(51) Int. Cl.
*H10W 70/65* (2026.01)
*H10W 70/05* (2026.01)
(Continued)

(52) U.S. Cl.
CPC ......... *H10W 74/137* (2026.01); *H10W 70/05* (2026.01); *H10W 70/65* (2026.01); *H10W 72/29* (2026.01); *H10W 74/141* (2026.01); *H10W 70/09* (2026.01); *H10W 70/60*

(2026.01); *H10W 70/652* (2026.01); *H10W 70/66* (2026.01); *H10W 72/01935* (2026.01); (Continued)

(58) Field of Classification Search
CPC . H01L 23/3171; H01L 24/02; H01L 21/4846; H10W 74/137; H10W 74/141; H10W 70/65
See application file for complete search history.

(56) References Cited

U.S. PATENT DOCUMENTS

| | | | |
|---|---|---|---|
| 11,610,785 B2 * | 3/2023 | Lee | ..................... H10W 74/012 |
| 2004/0094841 A1 * | 5/2004 | Matsuzaki | ............. H01L 24/12 |
| | | | 257/E23.021 |

(Continued)

*Primary Examiner* — Dale E Page
*Assistant Examiner* — Willner Jean Baptiste
(74) *Attorney, Agent, or Firm* — Robert D. Atkins; PATENT LAW GROUP: Atkins and Associates, P.C.

(57) ABSTRACT

A semiconductor device has a substrate and a first insulating layer formed over a first major surface of the substrate. A first redistribution layer is formed over the first insulating layer. A second insulating layer is formed over the first redistribution layer. A second redistribution layer can be formed over the second insulating layer, and a third insulating layer can be formed over the second redistribution layer. A protection layer is formed over a second major surface of the substrate for warpage control. A conductive layer is formed over the first redistribution layer, and a bump is formed over the conductive layer. An under bump metallization can be formed under the bump. The protection layer extends over a side surface of the substrate between the first major surface and second major surface. The protection layer further extends over a side surface of the first insulating layer.

20 Claims, 12 Drawing Sheets

(51) Int. Cl.

| | |
|---|---|
| *H10W 72/29* | (2026.01) |
| *H10W 74/10* | (2026.01) |
| *H10W 70/09* | (2026.01) |
| *H10W 70/60* | (2026.01) |
| *H10W 70/652* | (2026.01) |
| *H10W 70/66* | (2026.01) |
| *H10W 72/00* | (2026.01) |
| *H10W 72/20* | (2026.01) |
| *H10W 72/90* | (2026.01) |
| *H10W 90/10* | (2026.01) |

(52) U.S. Cl.
   CPC ...... *H10W 72/252* (2026.01); *H10W 72/9223* (2026.01); *H10W 72/923* (2026.01); *H10W 72/934* (2026.01); *H10W 72/9415* (2026.01); *H10W 72/942* (2026.01); *H10W 72/952* (2026.01); *H10W 90/10* (2026.01)

(56) References Cited

U.S. PATENT DOCUMENTS

| | | | |
|---|---|---|---|
| 2007/0045793 A1* | 3/2007 | Tanaka ................ | H01L 21/7813 |
| | | | 257/E21.601 |
| 2015/0155248 A1* | 6/2015 | Lin ..................... | H01L 23/3114 |
| | | | 257/737 |

* cited by examiner

SEMICONDUCTOR PACKAGES AND METHODS OF FORMING RDL AND SIDE AND BACK PROTECTION FOR SEMICONDUCTOR DEVICE

CLAIM OF DOMESTIC PRIORITY

The present application claims the benefit of U.S. Provisional Application No. 63/363,317, filed Apr. 21, 2022, which application is incorporated herein by reference.

FIELD OF THE INVENTION

The present invention relates in general to semiconductor devices and, more particularly, to a semiconductor device and method of forming a redistribution layer (RDL) and side and/or back protection for the semiconductor device.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor device often includes RDL formed on a major surface of a substrate for electrical interconnect. One or more insulating layers are formed around the RDL on the substrate for isolation and support. However, the opposing major surface of the substrate can be subject to damage and warpage.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1A:
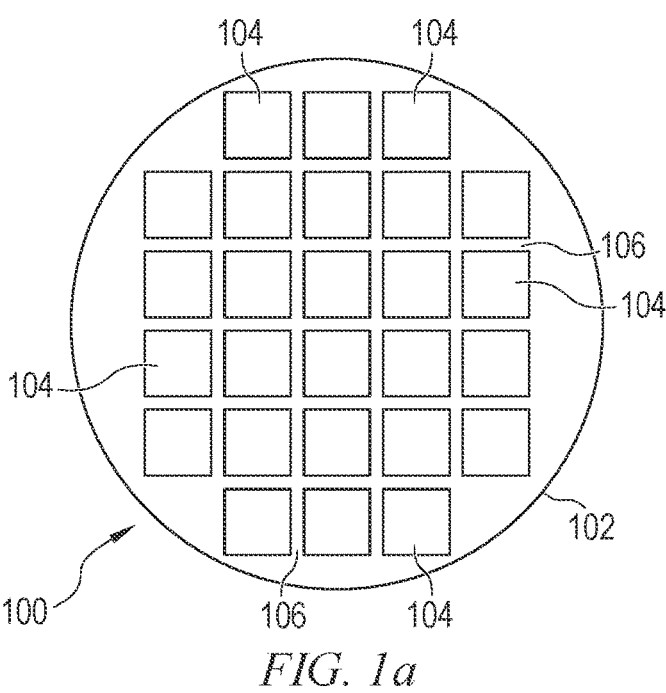
FIGS. 1a-1c illustrate a semiconductor wafer with a plurality of semiconductor die separated by a saw street.

FIG. 1a shows semiconductor wafer or substrate 100 with a base substrate material 102, such as silicon (Si), silicon carbide (SiC), cubic silicon carbide (3C-SiC), germanium, aluminum phosphide, aluminum arsenide, gallium arsenide, gallium nitride, indium phosphide, diamond, and all families of III-V and II-VI semiconductor materials for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
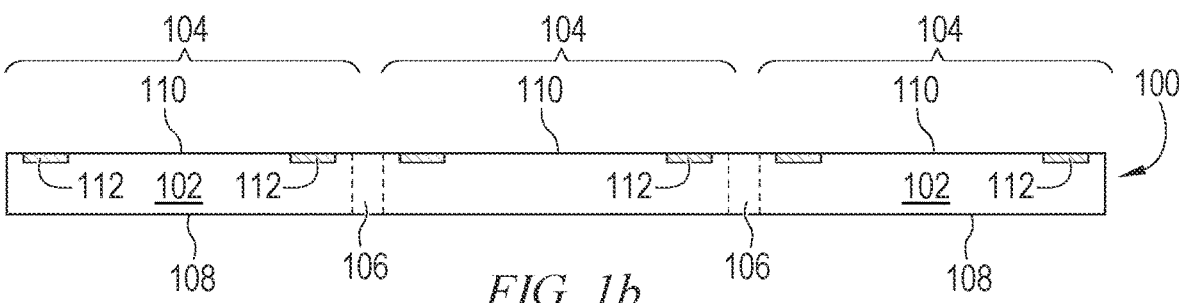

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other active signal processing circuit. Semiconductor die 104 may also contain IPDs, such as diodes, inductors, capacitors, resistors, and other passive components.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
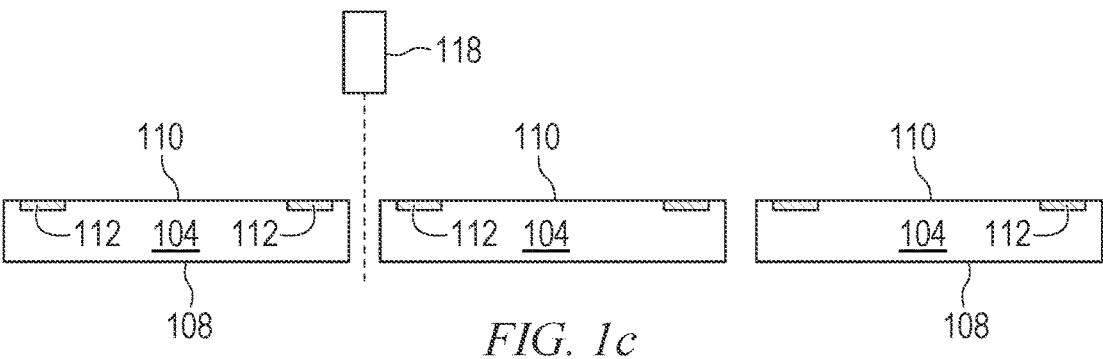

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) post singulation.

Figure 2A:
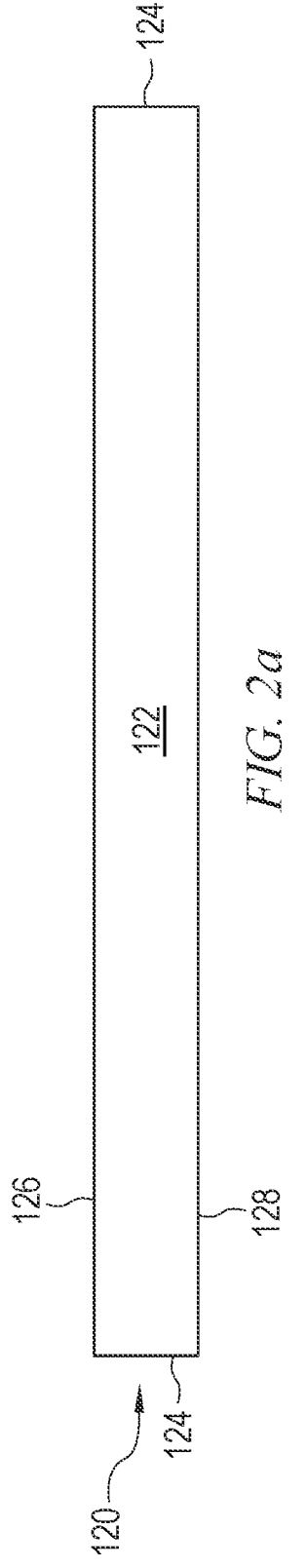
FIGS. 2a-2f illustrate forming an RDL and backside protection on a substrate.

FIGS. 2a-2f illustrate a process of forming an RDL and backside protection on a substrate. FIG. 2a shows a cross-sectional view of substrate 120 made with semiconductor material or insulating material 122. In one embodiment, substrate 120 represents a portion of one semiconductor die 104 of semiconductor wafer 100 made with semiconductor material, as described above. Alternatively, substrate 120 can be a portion of an interconnect substrate with conductive layer separated by insulating material. Accordingly, substrate 120 can represent a semiconductor wafer, die, panel, or other support structure. Substrate 120 has oppositive major surfaces 126 and 128 and side surfaces 124.

Figure 2B:
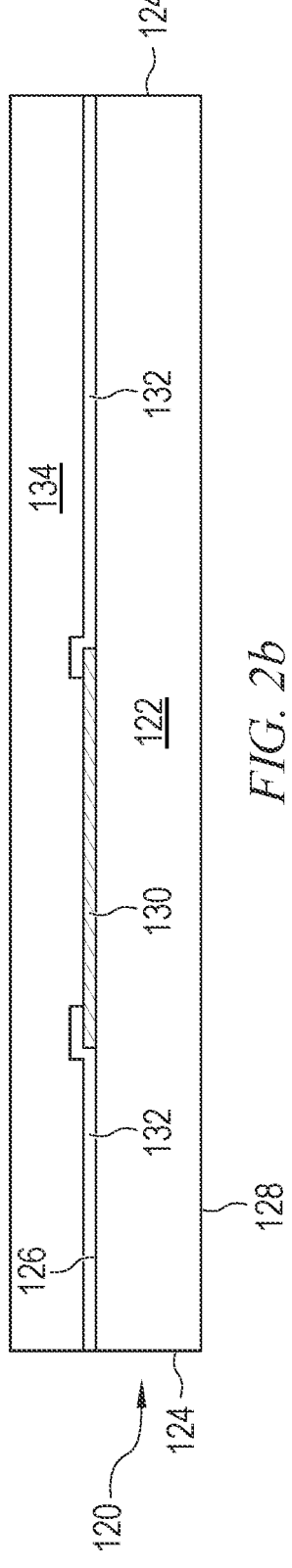

In FIG. 2b, an electrically conductive layer 130 is formed over surface 126 of substrate 120 using PVD, CVD, electrolytic plating, electroless plating process, or other suitable metal deposition process. Conductive layer 130 can be one or more layers of Al, Cu, Sn, Ni, Au, Ag, or other suitable electrically conductive material. Conductive layer 130 operates as a contact pad electrically connected to the circuits or conductive layers within substrate 120.

An insulating or passivation layer 132 is formed over surface 126 and conductive layer 130 using PVD, CVD, printing, lamination, spin coating, spray coating, sintering or thermal oxidation. Insulating layer 132 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 132 is a photo imageable material. A portion of insulating layer 132 is removed by etching or laser direct ablation (LDA) to expose conductive layer 130.

Figure 2C:
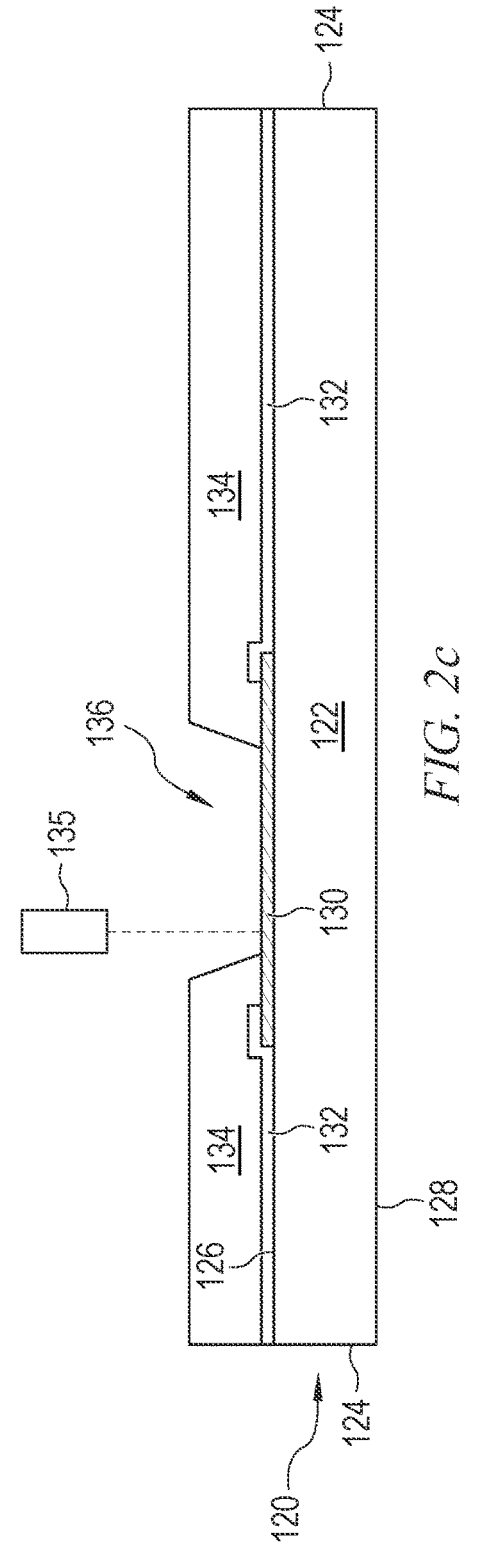

An insulating or passivation layer 134 is formed over insulating layer 132 and conductive layer 130 using spin coating or spray coating. Insulating layer 134 contains one or more layers of polyimide, BCB, PBO, and other material having similar insulating and structural properties. Insulating layer 134 is a photo imageable material with a cure temperature, preferably below 250° C., and not exceeding 400° C. and thickness of 15-40 micrometers (μm). In FIG. 2c, a portion of insulating layer 134 is removed by etching or LDA using laser 135 to form via 136 and expose conductive layer 130.

Figure 2D:
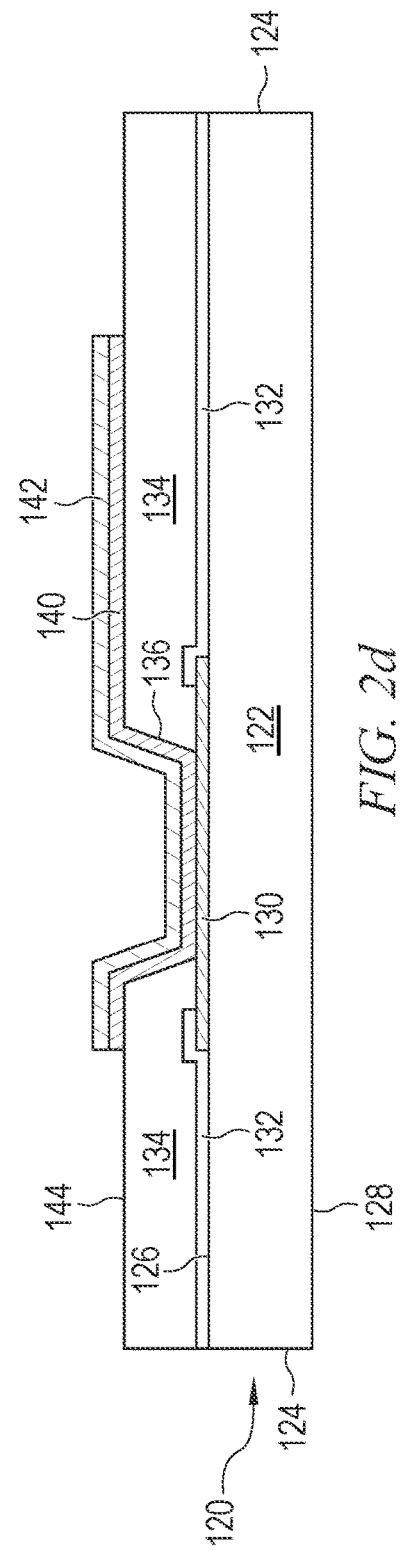

In FIG. 2d, electrically conductive layer 140 is formed over surface 144 of insulating layer 134 and into via 136 to contact conductive layer 130 using PVD or other suitable metal deposition process. An electrically conductive layer 142 is formed over conductive layer 140 and into via 136 using PVD or other suitable metal deposition process. Conductive layers 140 and 142 can be one or more layers of Ti, Cu, Ni, Au, Ag, or other suitable electrically conductive material.

Figures 2E, 2F:
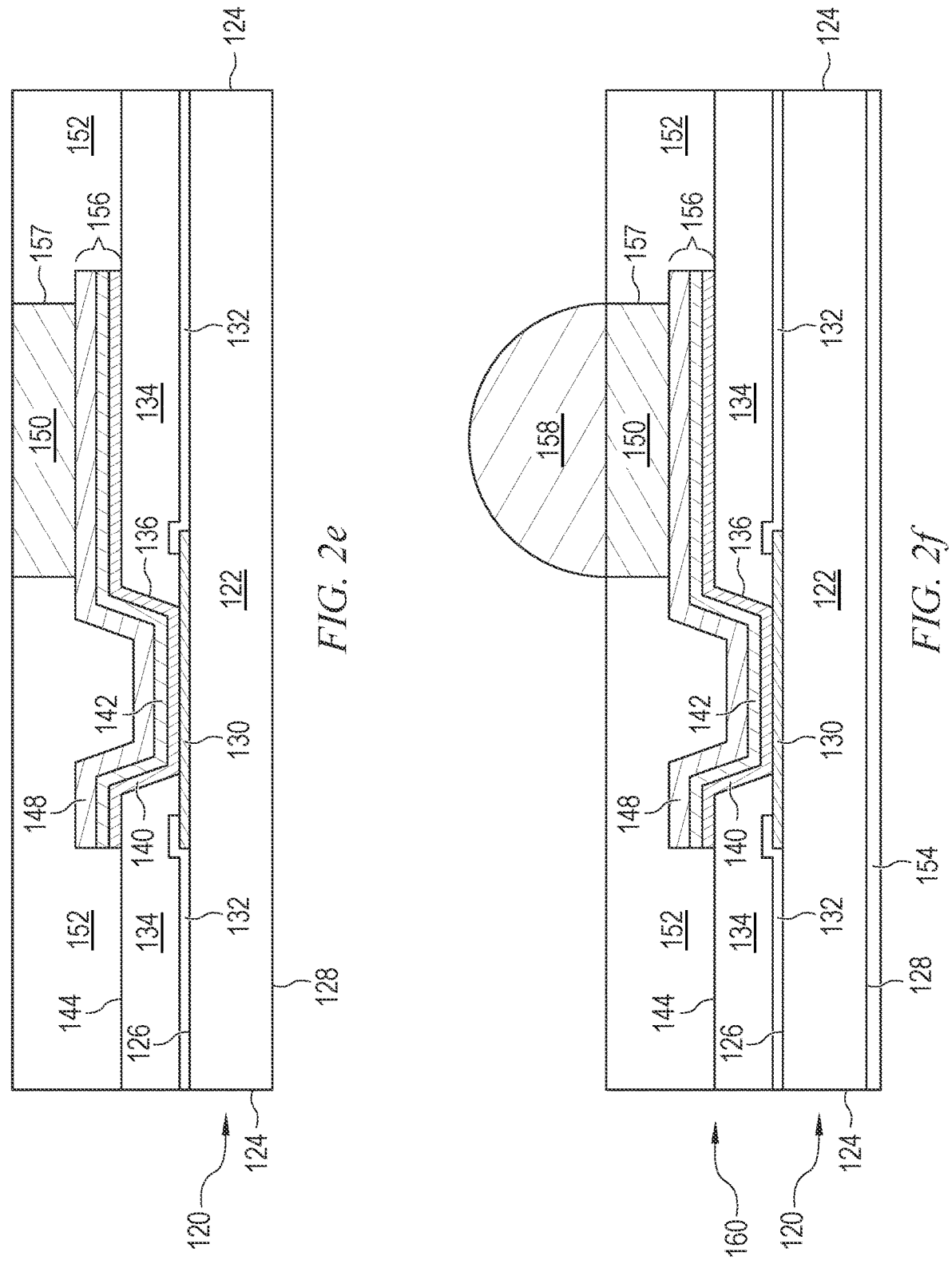

In FIG. 2e, electrically conductive layer 148 is formed over conductive layer 142 using electrolytic plating, electroless plating process, or other suitable metal deposition process. Conductive layer 148 can be one or more layers of Cu, Sn, Ni, Au, Ag, or other suitable electrically conductive material. The combination of conductive layers 140, 142, and 148 operates as RDL 156 to transfer electrical signals laterally and vertically across substrate 120. All RDLs described herein can be used for fan-in and fan-out configurations.

An electrically conductive layer 150 is formed over conductive layer 148 laterally offset from via 136 using electrolytic plating, electroless plating process, or other suitable metal deposition process. Conductive layer 150 can be one or more layers of Cu, Sn, Ni, Au, Ag, or other suitable electrically conductive material. Conductive layer 150 operates as a vertical interconnect or post to transfer electrical signals vertically through insulating layer 152 above substrate 120.

An insulating or protection layer 152 is formed over insulating layer 134 and conductive layer 148 and around conductive layer 150 using printing, lamination, spin coating, or spray coating. Insulating layer 152 contains one or more layers of SiO2, solder resist, polyimide, BCB, PBO, and other material having similar insulating and structural properties. In another embodiment, insulating layer 152 includes an epoxy resin with filler, such as Si. Alternatively, insulating layer 152 can be a non-photo imageable dielectric material having less shrinkage, lower modulus or coefficient of thermal expansion (CTE) than insulating layer 134 for warpage control of substrate 120. Insulating layer 152 is typically a different material from insulating layer 134. Conductive layer 150 can be formed after insulating layer 152. Insulating layer 152 provides protection for side surface 157 of conductive layer 150.

In FIG. 2f, electrically conductive bump material is deposited over conductive layer 150 using electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 158. In one embodiment, bump 158 is formed over an under bump metallization (UBM) having a wetting layer, barrier layer, and adhesive layer. Bump 158 can also be compression bonded or thermocompression bonded to conductive layer 150. Bump 158 represents one type of external interconnect structure that can be formed over conductive layer 150. The interconnect structure can also use bond wires, conductive paste, stud bump, micro bump, or other electrical interconnect.

An insulating or protection layer 154 is formed over surface 128 of substrate 120 using printing, lamination, spin coating, or spray coating. Insulating layer 154 contains one or more layers of solder resist, polyimide, BCB, PBO, and other material having similar insulating and structural properties. Insulating layer 154 can be the same material or different material from insulating layer 152. Bump 158 can be formed after insulating layer 154. Insulating layer 154 provides backside protection for surface 128 of substrate 120.

Semiconductor package 160 provides RDL 156 as an interconnect between conductive layer 130 and bump 158. Insulating layer 152 provides protection for RDL 156 and side surfaces 157 of conductive layer 150, and insulating layer 154 provides backside protection for surface 128 of substrate 120. Semiconductor package 160 offers efficient and low cost manufacturing, improved interconnect functionality and accuracy for subsequent manufacturing steps, and protection for side surfaces and back surfaces to increase reliability of the device.

Figures 3A, 3B:
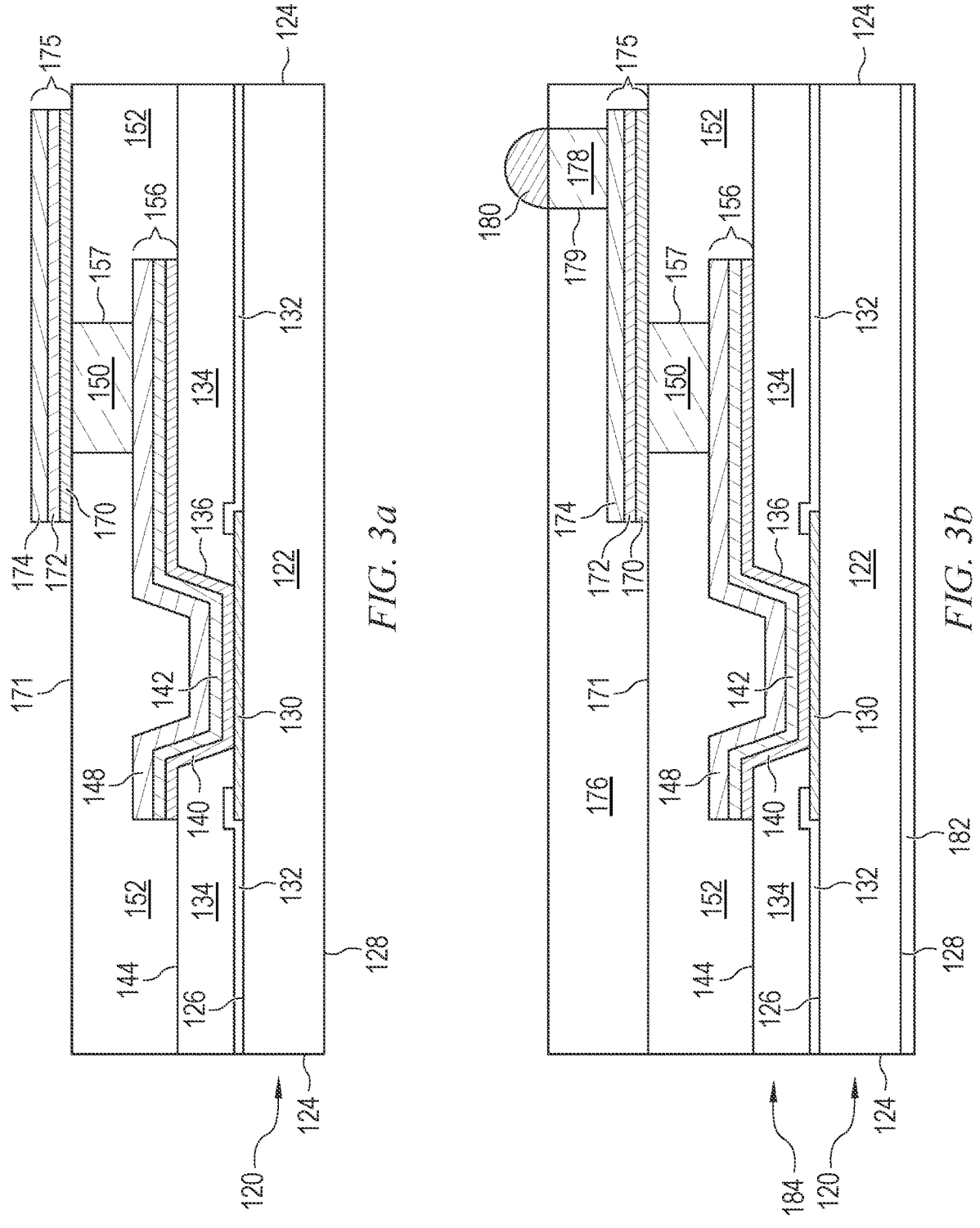
FIGS. 3a-3b illustrate forming multiple layers of RDL and backside protection on a substrate.

In another embodiment, continuing from FIG. 2e, electrically conductive layer 170 is formed over surface 171 of insulating layer 152 and conductive layer 150 using PVD or other suitable metal deposition process, as shown in FIG. 3a. An electrically conductive layer 172 is formed over conductive layer 170 using PVD or other suitable metal deposition process. An electrically conductive layer 174 is formed over conductive layer 172 using PVD, CVD, electrolytic plating, electroless plating process, or other suitable metal deposition process. Conductive layers 170-174 can be one or more layers of Ti, Cu, Ni, Au, Ag, or other suitable electrically conductive material. The combination of conductive layers 170-174 operates as RDL 175 to transfer electrical signals laterally and vertically across substrate 120. Additional RDL layers can be formed with insulating layers like 152 and RDLs like 175.

In FIG. 3b, electrically conductive layer 178 is formed over conductive layer 174 laterally offset from conductive layer 150 using electrolytic plating, electroless plating process, or other suitable metal deposition process. Conductive layer 178 can be one or more layers of Cu, Sn, Ni, Au, Ag, or other suitable electrically conductive material. Conductive layer 178 operates as a vertical interconnect or post to transfer electrical signals vertically through insulating layer 176.

An insulating or protection layer 176 is formed over insulating layer 152 and conductive layer 174 and around conductive layer 178 using printing, lamination, spin coating, or spray coating. Insulating layer 176 contains one or more layers of SiO2, solder resist, polyimide, BCB, PBO, and other material having similar insulating and structural properties. Insulating layer 176 provides protection for side surface 179 of conductive layer 178. Conductive layer 178 can be formed after insulating layer 176.

An electrically conductive bump material is deposited over conductive layer 178 using electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 178 using a suitable attachment or bonding process. In one embodiment, the bump material is reflowed by heating the material above its melting point to form balls or bumps 180. In one embodiment, bump 180 is formed over a UBM having a wetting layer, barrier layer, and adhesive layer. Bump 180 can also be compression bonded or thermocompression bonded to conductive layer 178. Bump 180 represents one type of external interconnect structure that can be formed over conductive layer 178. The interconnect structure can also use bond wires, conductive paste, stud bump, micro bump, or other electrical interconnect.

An insulating or passivation layer 182 is formed over surface 128 of substrate 120 using printing, lamination, spin coating, or spray coating. Insulating layer 182 contains one or more layers of solder resist, polyimide, BCB, PBO, and other material having similar insulating and structural properties. In another embodiment, insulating layer 182 includes an epoxy resin with filler, such as Si. Alternatively, insulating layer 182 can be a non-photo imageable dielectric material having less shrinkage, lower modulus or CTE than insulating layer 134. Insulating layer 182 can be the same material or different material from insulating layer 152. Insulating layer 182 provides backside protection for surface 128 and warpage control of substrate 120. Bump 180 can be formed after insulating layer 182.

Semiconductor package 184 provides multiple RDLs 156 and 175 as an interconnect between conductive layer 130 and bump 180. Insulating layer 176 provides protection for RDL 175 and side surfaces 179 of conductive layer 178, and insulating layer 182 provides backside protection for surface 128 of substrate 120. Semiconductor package 184 offers efficient and low cost manufacturing, improved interconnect functionality and accuracy for subsequent manufacturing steps, and protection for side surfaces and back surfaces to increase reliability of the device.

Figure 4A:
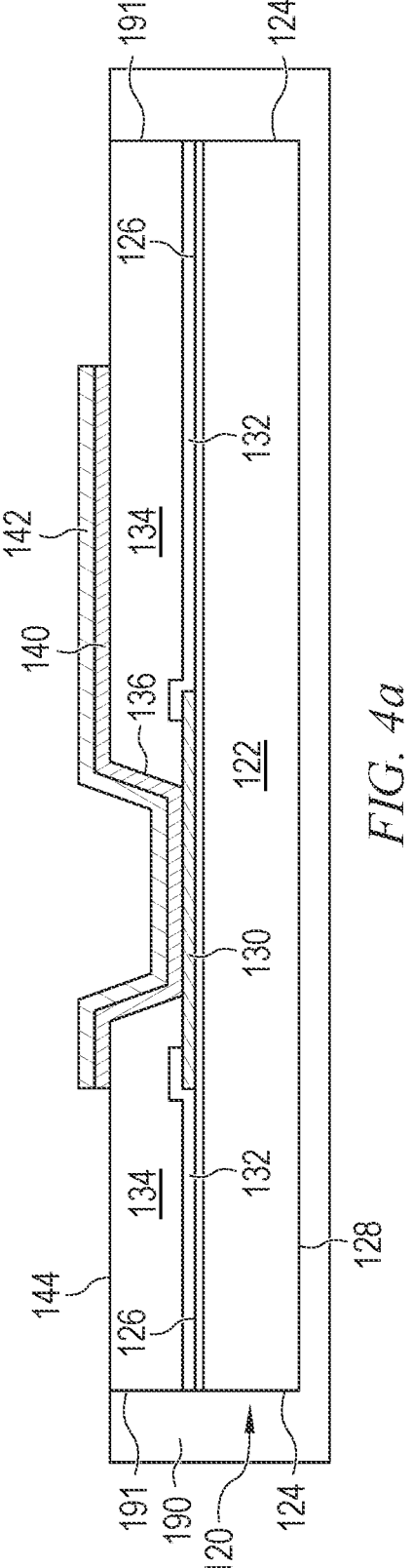
FIGS. 4a-4c illustrate forming an RDL and side and back protection on a substrate.

In another embodiment, continuing from FIG. 2d, insulating or protection layer 190 is formed over side surface 191 of insulating layer 134 and side surface 124 of substrate 120, and major surface 128 of substrate 120 using printing, lamination, spin coating, or spray coating as shown in FIG. 4a. Insulating layer 190 contains one or more layers of solder resist, polyimide, BCB, PBO, and other material having similar insulating and structural properties. Alternatively, insulating layer 190 can be a non-photo imageable dielectric material having less shrinkage, lower modulus or CTE than insulating layer 134. Insulating layer 190 provides protection for side surfaces 124 and 191 and major surface 128 and warpage control of substrate 120.

In another embodiment, insulating layer 190 is an encapsulant or molding compound deposited over and around side surface 191 of insulating layer 134 and side surface 124 of substrate 120, and major surface 128 of substrate 120 using a paste printing, compressive molding, transfer molding, liquid encapsulant molding, spin coating, or other suitable applicator. Encapsulant 190 can be liquid or granular polymer composite material, such as epoxy resin with Si filler, epoxy acrylate with filler, or polymer with proper filler. Encapsulant 190 is non-conductive, provides structural support, and environmentally protects the semiconductor device from external elements and contaminants. Encapsulant 190 provides protection for side surfaces 124 and 191 and major surface 128.

Figure 4B:
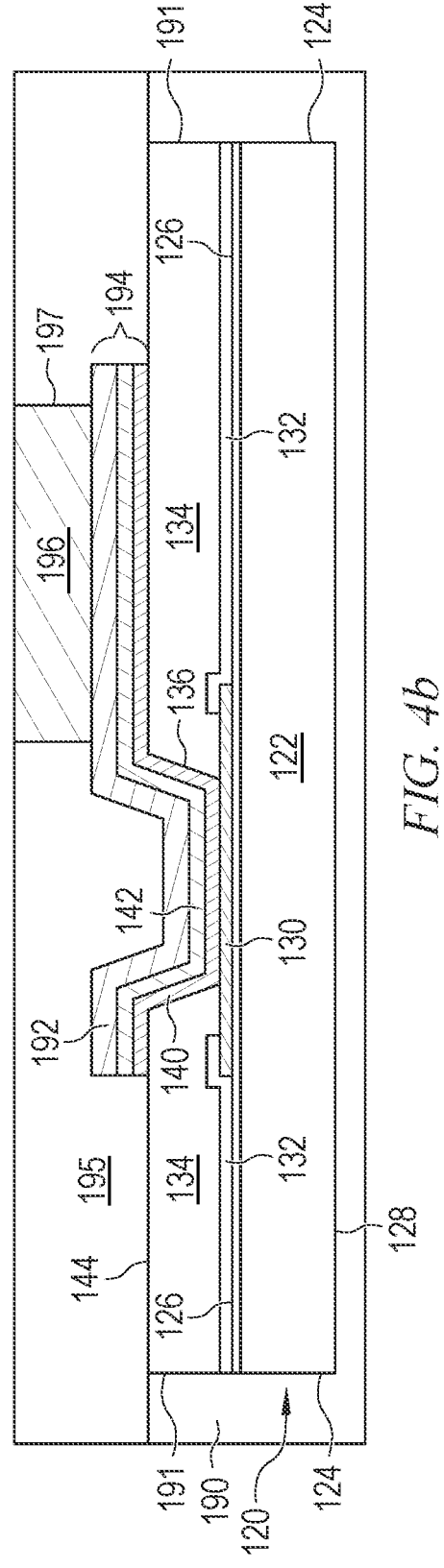

In FIG. 4b, electrically conductive layer 192 is formed over conductive layer 142 using electrolytic plating, electroless plating process, or other suitable metal deposition process. Conductive layer 192 can be one or more layers of Cu, Sn, Ni, Au, Ag, or other suitable electrically conductive material. The combination of conductive layers 140, 142, and 192 operates as RDL 194 to transfer electrical signals laterally and vertically across substrate 120. Additional RDL layers can be formed with insulating layers like 134 and RDLs like 194.

An electrically conductive layer 196 is formed over conductive layer 192 laterally offset from via 136 using electrolytic plating, electroless plating process, or other suitable metal deposition process. Conductive layer 196 can be one or more layers of Cu, Sn, Ni, Au, Ag, or other suitable electrically conductive material. Conductive layer 196 operates as a vertical interconnect or post to transfer electrical signals vertically through insulating layer 195 above substrate 120.

An insulating or protection layer 195 is formed over insulating layer 134 and conductive layer 192 and around conductive layer 196 using printing, lamination, spin coating, or spray coating. Insulating layer 195 contains one or more layers of SiO2, solder resist, polyimide, BCB, PBO, and other material having similar insulating and structural properties. In another embodiment, insulating layer 195 includes an epoxy resin with filler, such as Si. Alternatively, insulating layer 195 can be a non-photo imageable dielectric material having less shrinkage, lower modulus or CTE than insulating layer 134 for warpage control of substrate 120. Insulating layer 195 is typically a different material from insulating layer 134. Insulating layer 190 can be the same material or different material from insulating layer 195. Conductive layer 196 can be formed after insulating layer 195. Insulating layer 195 provides protection for side surface 197 of conductive layer 196.

Figure 4C:
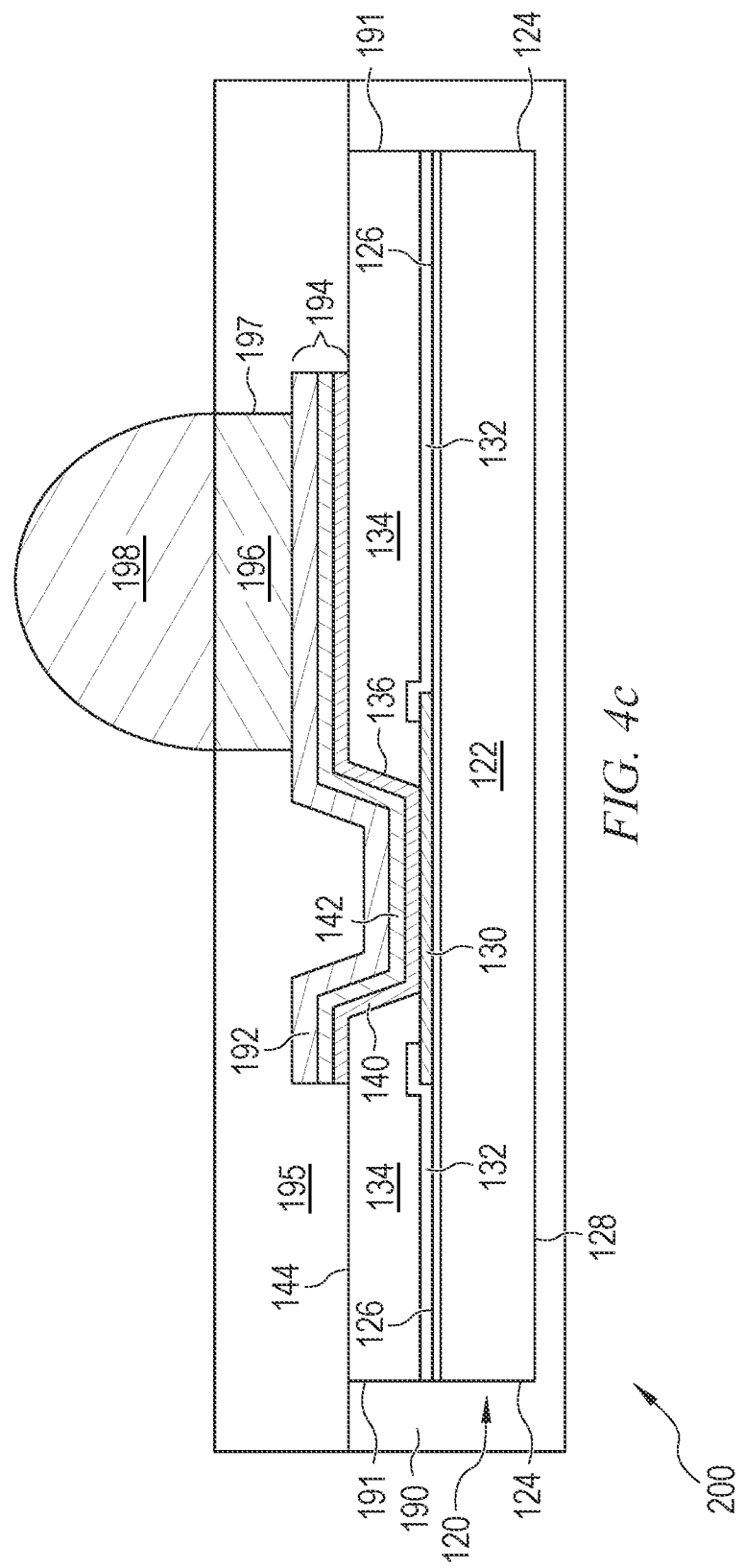

In FIG. 4c, electrically conductive bump material is deposited over conductive layer 196 using electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 196 using a suitable attachment or bonding process. In one embodiment, the bump material is reflowed by heating the material above its melting point to form balls or bumps 198. In one embodiment, bump 198 is formed over a UBM having a wetting layer, barrier layer, and adhesive layer. Bump 198 can also be compression bonded or thermocompression bonded to conductive layer 196. Bump 198 represents one type of external interconnect structure that can be formed over conductive layer 196. The interconnect structure can also use bond wires, conductive paste, stud bump, micro bump, or other electrical interconnect.

Semiconductor package 200 provides RDL 194 as an interconnect between conductive layer 130 and bump 198. Insulating layer 195 provides protection for RDL 194 and side surfaces 197 of conductive layer 196. Insulating layer 190 provides protection for side surfaces 191 and 124 and back surface 128. Semiconductor package 200 offers efficient and low cost manufacturing, improved interconnect functionality and accuracy for subsequent manufacturing steps, and protection for side surfaces and back surfaces to increase reliability of the device.

Figure 5A:
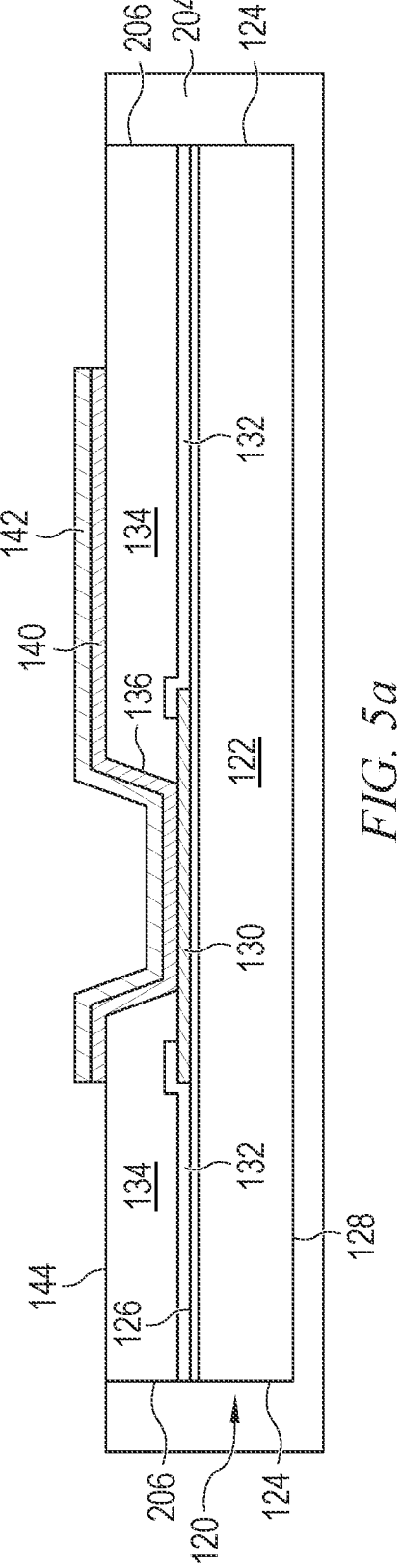
FIGS. 5a-5c illustrate forming multiple layers of RDL and side and back protection on a substrate.

In another embodiment, continuing from FIG. 2d, insulating or protection layer 204 is formed over side surface 206 of insulating layer 134 and side surface 124 of substrate 120, and major surface 128 of substrate 120 using printing, lamination, spin coating, or spray coating, as shown in FIG. 5a. Insulating layer 204 contains one or more layers of solder resist, polyimide, BCB, PBO, and other material having similar insulating and structural properties. Alternatively, insulating layer 204 can be a non-photo imageable dielectric material having less shrinkage, lower modulus or CTE than insulating layer 134. Insulating layer 204 provides protection for side surfaces 124 and 206 and major surface 128 and warpage control of substrate 120.

In another embodiment, insulating layer 204 is an encapsulant or molding compound deposited over side surface 206 of insulating layer 134 and side surface 124 of substrate 120, and major surface 128 of substrate 120 using a paste printing, compressive molding, transfer molding, liquid encapsulant molding, spin coating, or other suitable applicator. Encapsulant 204 can be liquid or granular polymer composite material, such as epoxy resin with Si filler, epoxy acrylate with filler, or polymer with proper filler. Encapsulant 204 is non-conductive, provides structural support, and environmentally protects the semiconductor device from external elements and contaminants. Encapsulant 204 provides protection for side surfaces 124 and 191 and major surface 128.

Figure 5B:
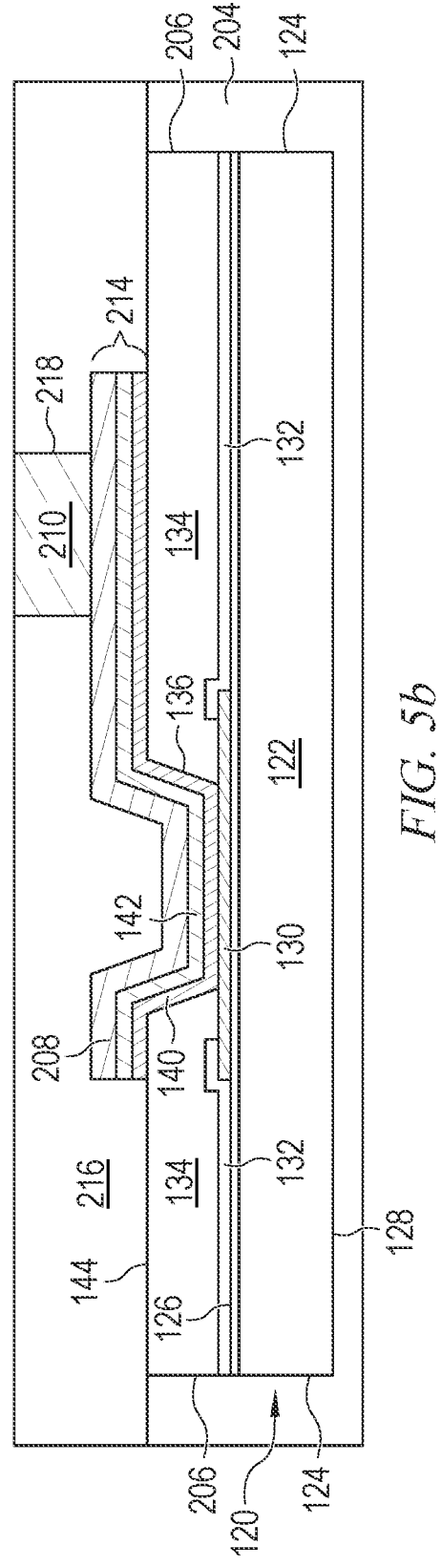

In FIG. 5b, electrically conductive layer 208 is formed over conductive layer 142 using electrolytic plating, electroless plating process, or other suitable metal deposition process. Conductive layer 208 can be one or more layers of Cu, Sn, Ni, Au, Ag, or other suitable electrically conductive material. The combination of conductive layers 140, 142, and 208 operates as RDL 214 to transfer electrical signals laterally and vertically across substrate 120. Additional RDL layers can be formed with insulating layers like 134 and RDLs like 214.

An electrically conductive layer 210 is formed over conductive layer 208 laterally offset from via 136 using electrolytic plating, electroless plating process, or other suitable metal deposition process. Conductive layer 210 can be one or more layers of Cu, Sn, Ni, Au, Ag, or other suitable electrically conductive material. Conductive layer 210 operates as a vertical interconnect or post to transfer electrical signals vertically through insulating layer 216 above substrate 120.

An insulating or protection layer 216 is formed over insulating layer 134 and conductive layer 208 and around conductive layer 210 using printing, lamination, spin coating, or spray coating. Insulating layer 216 contains one or more layers of SiO2, solder resist, polyimide, BCB, PBO, and other material having similar insulating and structural properties. In another embodiment, insulating layer 216 includes an epoxy resin with filler, such as Si. Alternatively, insulating layer 216 can be a non-photo imageable dielectric material having less shrinkage, lower modulus or CTE than insulating layer 134 for warpage control of substrate 120. Insulating layer 216 is typically a different material from insulating layer 134. Insulating layer 216 can be the same material or different material from insulating layer 204. Conductive layer 210 can be formed after insulating layer 216. Insulating layer 216 provides protection for side surface 218 of conductive layer 210.

Figure 5C:
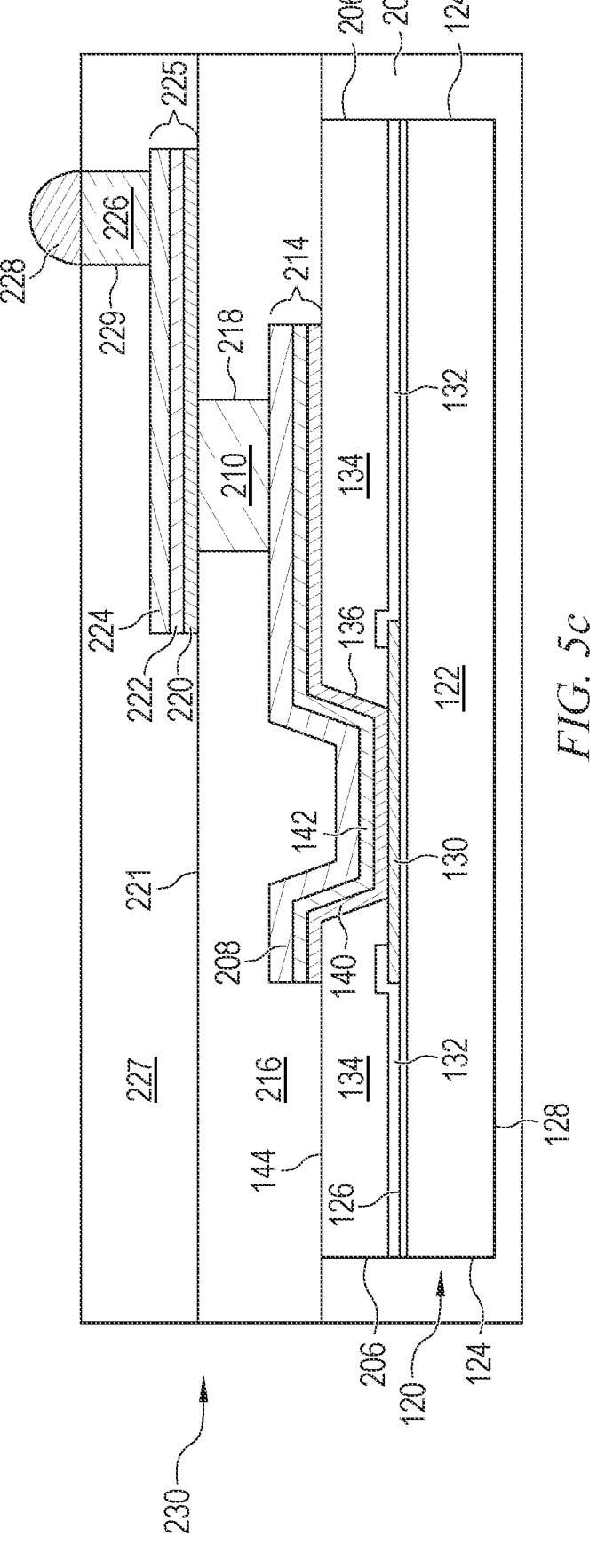

In FIG. 5c, electrically conductive layer 220 is formed over surface 221 of insulating layer 216 and conductive layer 210 using PVD or other suitable metal deposition process. An electrically conductive layer 222 is formed over conductive layer 220 using PVD or other suitable metal deposition process. An electrically conductive layer 224 is formed over conductive layer 222 using electrolytic plating, electroless plating process, or other suitable metal deposition process. Conductive layers 220-224 can be one or more layers of Cu, Sn, Ni, Au, Ag, or other suitable electrically conductive material. The combination of conductive layers 220-224 operates as RDL 225 to transfer electrical signals laterally and vertically across substrate 120.

An electrically conductive layer 226 is formed over conductive layer 224 laterally offset from conductive layer 210 using electrolytic plating, electroless plating process, or other suitable metal deposition process. Conductive layer 226 can be one or more layers of Cu, Sn, Ni, Au, Ag, or other suitable electrically conductive material. Conductive layer 226 operates as a vertical interconnect or post to transfer electrical signals vertically through insulating layer 227.

An insulating or protection layer 227 is formed over insulating layer 216 and conductive layer 224 and around conductive layer 226 using printing, lamination, spin coating, or spray coating. Insulating layer 227 contains one or more layers of SiO2, solder resist, polyimide, BCB, PBO, and other material having similar insulating and structural properties. Insulating layer 227 provides protection for side surface 229 of conductive layer 226. Conductive layer 226 can be formed after insulating layer 227.

An electrically conductive bump material is deposited over conductive layer 226 using electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 226 using a suitable attachment or bonding process. In one embodiment, the bump material is reflowed by heating the material above its melting point to form balls or bumps 228. In one embodiment, bump 228 is formed over a UBM having a wetting layer, barrier layer, and adhesive layer. Bump 228 can also be compression bonded or thermocompression bonded to conductive layer 226. Bump 228 represents one type of external interconnect structure that can be formed over conductive layer 226. The interconnect structure can also use bond wires, conductive paste, stud bump, micro bump, or other electrical interconnect.

Semiconductor package 230 uses multiple RDLs 214 and 225 as an interconnect between conductive layer 130 and bump 228. Insulating layer 216 provides protection for RDL 214 and side surfaces 218 of conductive layer 210. Insulating layer 227 provides protection for RDL 225 and side surfaces 229 of conductive layer 226. Insulating layer 204 provides protection for side surfaces 206 and 124 and back surface 128. Semiconductor package 230 offers efficient and low cost manufacturing, improved interconnect functionality and accuracy for subsequent manufacturing steps, and protection for side surfaces and back surfaces to increase reliability of the device.

Figure 6:
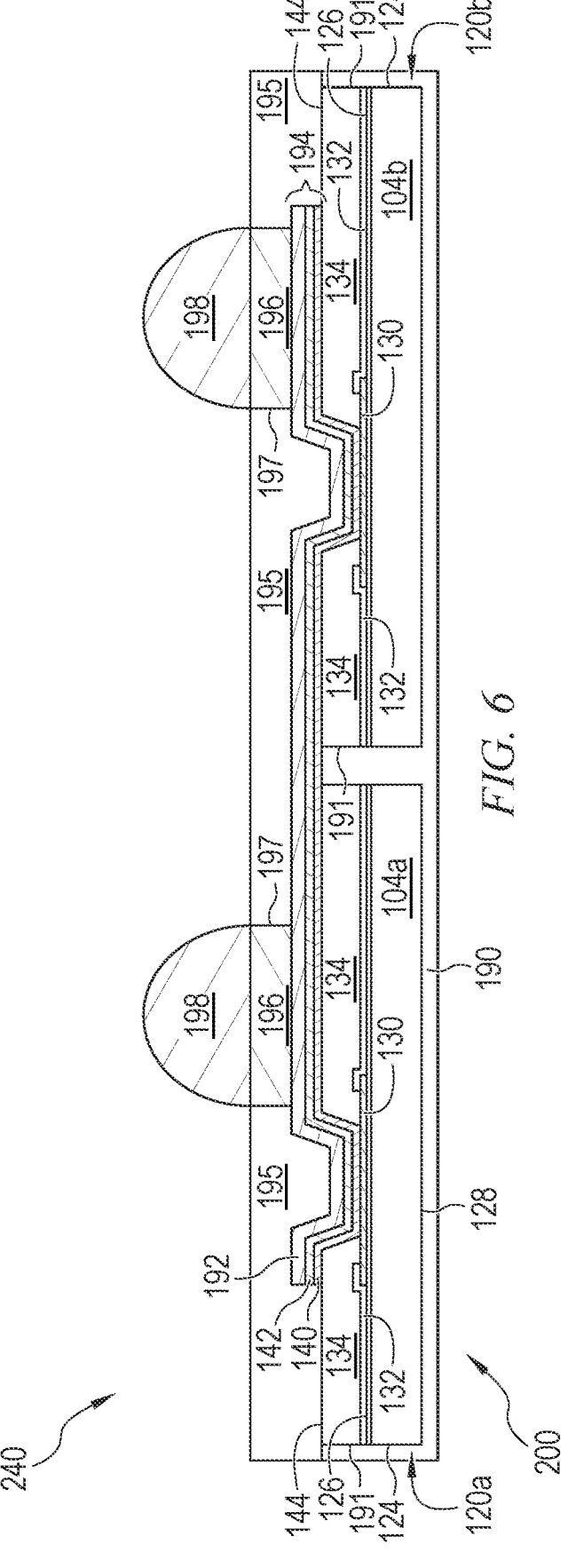
FIG. 6 illustrates forming an RDL connecting two adjacent semiconductor die and side and back protection on a substrate.

FIG. 6 illustrates another embodiment, similar to FIGS. 4a-4c, with RDL 194 extending across two adjacent substrates 120a and 120b. In one embodiment, substrate 120a is a first semiconductor die 104a and substrate 120b is a second semiconductor die 104b, disposed adjacent to semiconductor die 104*a*, with reference to FIGS. 1*a*-1*c*. Insulating layer 195 provides protection for RDL 194 and side surfaces 197 of conductive layer 196. Insulating layer 190 provides protection for side surfaces 191 and 124 and back surface 128.

In one embodiment, insulating layer 190 is an encapsulant or molding compound deposited over and around side surface 191 of insulating layer 134 and side surface 124 of substrate 120, and major surface 128 of substrate 120 using a paste printing, compressive molding, transfer molding, liquid encapsulant molding, vacuum lamination, spin coating, or other suitable applicator. Encapsulant 190 can be liquid or granular polymer composite material, such as epoxy resin with Si filler, epoxy acrylate with filler, or polymer with proper filler. Encapsulant 190 is non-conductive, provides structural support, and environmentally protects the semiconductor device from external elements and contaminants. Encapsulant 190 provides protection for side surfaces 124 and 191 and major surface 128 of semiconductor die 104*a* and 104*b*.

Semiconductor package 240 provides RDL 194 as an interconnect between conductive layer 130 and bump 198. Insulating layer 195 provides protection for RDL 194 and side surfaces 197 of conductive layer 196. Insulating layer 190 provides protection for side surfaces 191 and 124 and back surface 128. Semiconductor package 240 offers efficient and low cost manufacturing, improved interconnect functionality and accuracy for subsequent manufacturing steps, and protection for side surfaces and back surfaces to increase reliability of the device.

Figure 7A:
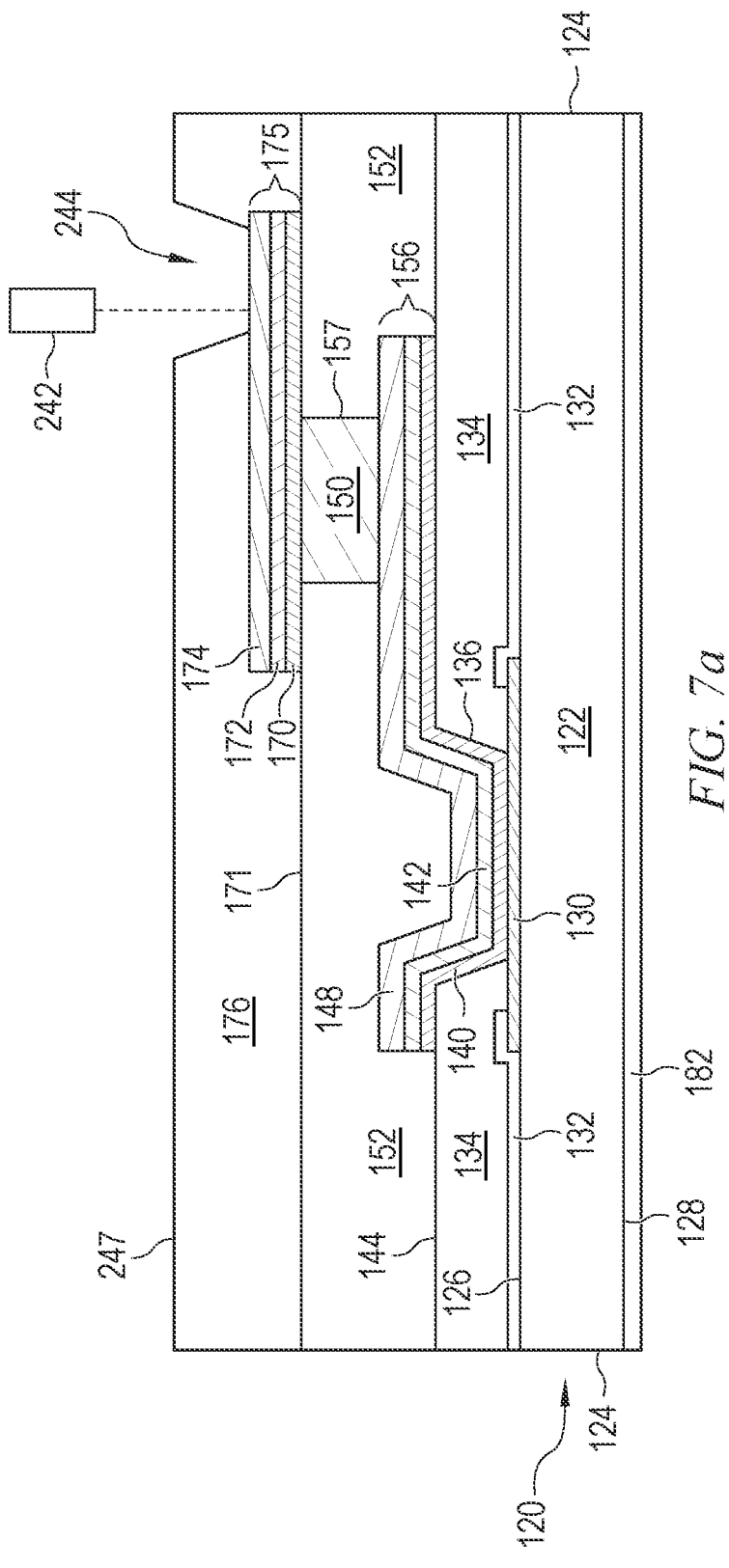
FIGS. 7a-7b illustrate forming multiple layers of RDL with UBM and backside protection on a substrate.
Figure 7B:
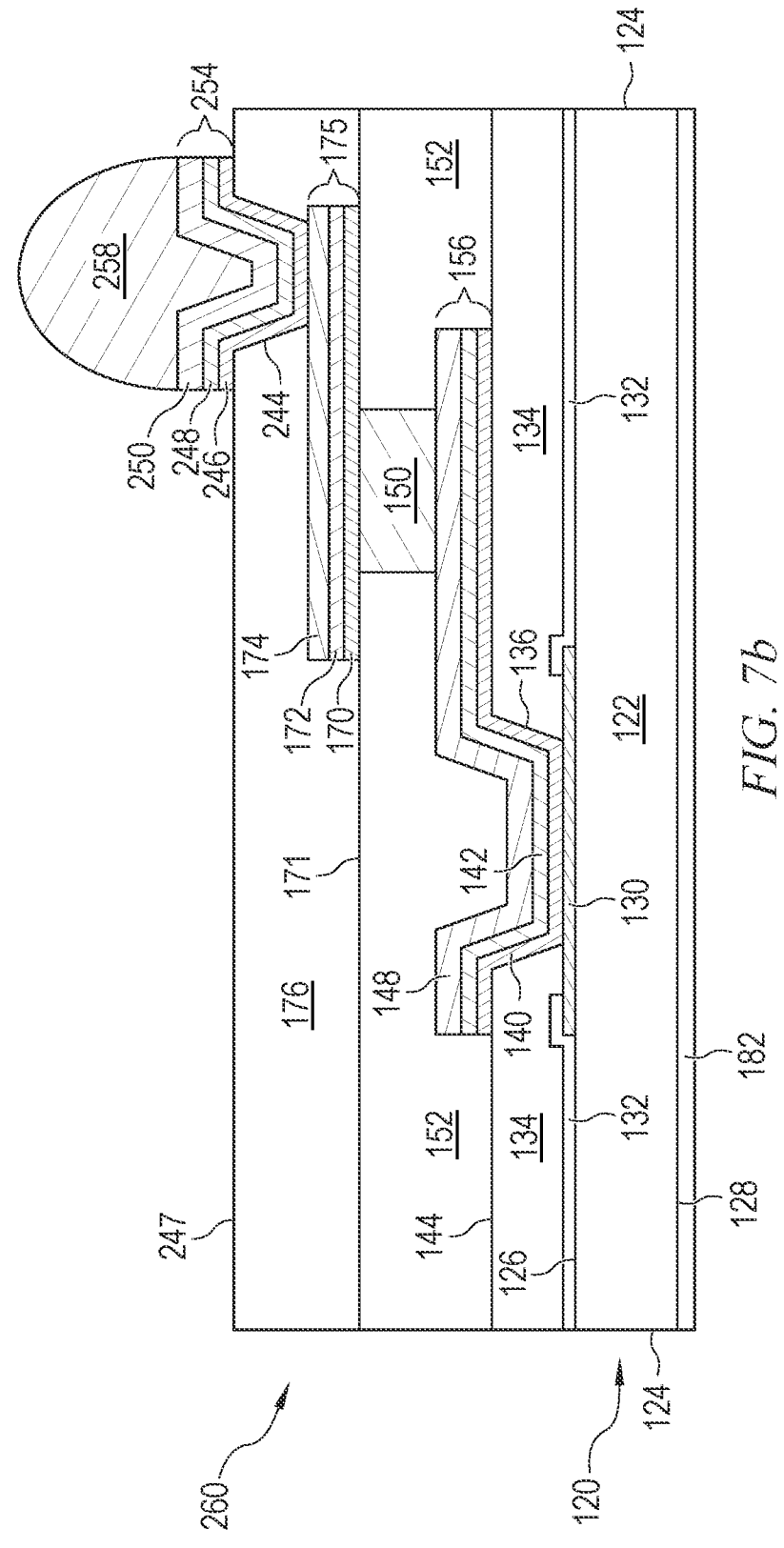

FIGS. 7*a*-7*b* illustrate another embodiment, similar to FIGS. 3*a*-3*b*, absent conductive layer 178. Instead, a portion of insulating layer 176 is removed by etching or LDA using laser 242 to form via 244 and expose conductive layer 174, as shown in FIG. 7*a*. Insulating layer 176 can be a photo imageable material.

In FIG. 7*b*, electrically conductive layer 246 is formed over surface 247 of insulating layer 176 and into via 244 using PVD, CVD, electrolytic plating, electroless plating process, or other suitable metal deposition process. An electrically conductive layer 248 is formed over conductive layer 246 using PVD, CVD, electrolytic plating, electroless plating process, or other suitable metal deposition process. An electrically conductive layer 250 is formed over conductive layer 248 using PVD, CVD, electrolytic plating, electroless plating process, or other suitable metal deposition process. Conductive layers 246-250 can be one or more layers of Al, Cu, Sn, Ni, Au, Ag, or other suitable electrically conductive material. The combination of conductive layers 246-250 operates as a wetting layer, barrier layer, and adhesive layer of UBM 254.

An electrically conductive bump material is deposited over UBM 254 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 254 using a suitable attachment or bonding process. In one embodiment, the bump material is reflowed by heating the material above its melting point to form balls or bumps 258. Bump 258 can also be compression bonded or thermocompression bonded to UBM 254. Bump 258 represents one type of external interconnect structure that can be formed over UBM 254. The interconnect structure can also use bond wires, conductive paste, stud bump, micro bump, or other electrical interconnect.

Semiconductor package 260 provides RDL 156 and 175 as an interconnect between conductive layer 130 and bump 258. Insulating layer 152 provides protection for RDL 156 and side surfaces 157 of conductive layer 150. Insulating layer 176 provides protection for RDL 175 and side surfaces 179 of conductive layer 178. Insulating layer 182 provides protection for back surface 128. Semiconductor package 260 offers efficient and low cost manufacturing, improved interconnect functionality and accuracy for subsequent manufacturing steps, and protection for side surfaces and back surfaces to increase reliability of the device.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate including a first major surface and a second major surface opposite the first major surface;
a first conductive layer formed in contact with the first major surface of the substrate;
a first insulating layer formed in contact with the first major surface of the substrate;
a second insulating layer formed in contact with the first insulating layer;
a redistribution layer formed in contact with the second insulating layer and the first conductive layer;
a third insulating layer formed over and in contact with a top surface of the redistribution layer and further in contact with the second insulating layer; and
a protection layer formed over the second major surface of the substrate and further extends over a side surface of the substrate between the first major surface and second major surface and further extending over a side surface of the second insulating layer to contact the third insulating layer.

2. The semiconductor device of claim 1, further including:
a second conductive layer formed over and in electrical connection with the redistribution layer; and
a bump formed over the second conductive layer.

3. The semiconductor device of claim 2, further including an under bump metallization formed under the bump.

4. The semiconductor device of claim 2, further including a vertical interconnect formed through the third insulating layer to make the electrical connection between the redistribution layer and second conductive layer.

5. The semiconductor device of claim 1, wherein the substrate includes a first semiconductor die.

6. The semiconductor device of claim 1, wherein the redistribution layer includes:
a second conductive layer formed in contact with the second insulating layer and first conductive layer;
a third conductive layer formed in contact with the second conductive layer; and
a fourth conductive layer formed in contact with the third conductive layer.

7. A semiconductor device, comprising:
a substrate;
a first conductive layer formed in contact with a first major surface of the substrate;
a first insulating layer formed in contact with the over a first major surface of the substrate;
a second insulating layer formed in contact with the first insulating layer;
a redistribution layer formed in contact with the second insulating layer;

a third insulating layer formed over and in contact with the redistribution layer and further in contact with the second insulating layer; and a protection layer formed over a second major surface of the substrate and further extending over a side surface of the substrate.

8. The semiconductor device of claim 7, further including:

a second conductive layer formed over and in electrical connection with the redistribution layer; and a bump formed over the second conductive layer.

9. The semiconductor device of claim 8, further including an under bump metallization formed under the bump.

10. The semiconductor device of claim 8, further including a vertical interconnect formed through the third insulating layer to make the electrical connection between the redistribution layer and second conductive layer.

11. The semiconductor device of claim 7, wherein the protection layer extends over the side surface of the substrate between the first major surface and second major surface.

12. The semiconductor device of claim 7, wherein the redistribution layer includes:

a second conductive layer formed in contact with the second insulating layer and first conductive layer;

a third conductive layer formed in contact with the second conductive layer; and a fourth conductive layer formed in contact with the third conductive layer.

13. The semiconductor device of claim 11, wherein the protection layer further extends over a side surface of the second insulating layer to contact the third insulating layer.

14. A method of making a semiconductor device, comprising:

providing a substrate;

forming a first conductive layer formed in contact with a first major surface of the substrate;

forming a first insulating layer in contact with the first major surface of the substrate;

forming a second insulating layer formed in contact with the first insulating layer;

forming a redistribution layer in contact with the second insulating layer;

forming a third insulating layer formed over and in contact with the redistribution layer and further in contact with the second insulating layer; and forming a protection layer over a second major surface of the substrate and further extending over a side surface of the substrate.

15. The method of claim 14, further including:

forming a second conductive layer over and in electrical connection with the redistribution layer; and forming a bump over the second conductive layer.

16. The method of claim 15, further including forming an under bump metallization under the bump.

17. The method of claim 15, further including forming a vertical interconnect through the third insulating layer to make the electrical connection between the redistribution layer and second conductive layer.

18. The method of claim 14, wherein the protection layer extends over the side surface of the substrate between the first major surface and second major surface.

19. The method of claim 14, wherein forming the redistribution layer includes:

forming a second conductive layer in contact with the second insulating layer and first conductive layer;

forming a third conductive layer in contact with the second conductive layer; and forming a fourth conductive layer in contact with the third conductive layer.

20. The method of claim 18, wherein the protection layer further extends over a side surface of the second insulating layer to contact the third insulating layer.

* * * * *